United States Patent
Suzuki

(10) Patent No.: US 11,222,808 B2
(45) Date of Patent: Jan. 11, 2022

(54) METHOD OF REMOVING CARRIER PLATE

(71) Applicant: DISCO CORPORATION, Tokyo (JP)

(72) Inventor: Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/001,142

(22) Filed: Aug. 24, 2020

(65) Prior Publication Data

US 2021/0066110 A1 Mar. 4, 2021

(30) Foreign Application Priority Data

Aug. 26, 2019 (JP) ............................. JP2019-153397

(51) Int. Cl.
*B32B 43/00* (2006.01)
*H01L 21/683* (2006.01)
*B32B 38/10* (2006.01)

(52) U.S. Cl.
CPC ........ *H01L 21/6836* (2013.01); *B32B 43/006* (2013.01); *B32B 38/10* (2013.01); *B32B 2457/14* (2013.01); *H01L 2221/68327* (2013.01); *H01L 2221/68386* (2013.01); *Y10T 156/1111* (2015.01); *Y10T 156/1121* (2015.01); *Y10T 156/1126* (2015.01); *Y10T 156/1168* (2015.01); *Y10T 156/1184* (2015.01);
(Continued)

(58) Field of Classification Search
CPC .. B38B 43/006; B32B 38/10; Y10T 156/1111; Y10T 156/1121; Y10T 156/1126; Y10T 156/1168; Y10T 156/1184; Y10T 156/1922; Y10T 156/1928; Y10T 156/1933
See application file for complete search history.

(56) References Cited

U.S. PATENT DOCUMENTS 5,863,375 A * 1/1999 Cha .................... B26F 3/004
156/701
6,066,229 A * 5/2000 Komine .............. B29C 63/0013
156/718
(Continued)

FOREIGN PATENT DOCUMENTS

JP 2016201519 A 12/2016

OTHER PUBLICATIONS

Suzuki, Katsuhiko, U.S. Appl. No. 17/003,462, filed Aug. 26, 2020.

*Primary Examiner* — Mark A Osele
*Assistant Examiner* — Nickolas R Harm
(74) *Attorney, Agent, or Firm* — Greer Burns & Crain Ltd.

(57) ABSTRACT

A method of removing a carrier plate is used to peel off and remove the carrier plate from a workpiece of a disk-shaped composite substrate in which the workpiece is disposed on a face side of the carrier plate with a temporary adhesive layer interposed therebetween. The method includes a step forming step of forming a step protruding laterally from the carrier plate more on a reverse side of the carrier plate than on the face side of the carrier plate, by removing an outer circumferential portion of the workpiece, an outer circumferential portion of the temporary adhesive layer, and a face-side side of an outer circumferential edge of the carrier plate, a starting point region forming step of forming a starting point region that acts as a starting point in peeling off the carrier plate from the workpiece.

17 Claims, 8 Drawing Sheets

(52) U.S. Cl.
CPC .... *Y10T 156/1922* (2015.01); *Y10T 156/1928* (2015.01); *Y10T 156/1933* (2015.01)

(56) References Cited

U.S. PATENT DOCUMENTS

| | | | |
|---|---|---|---|
| 6,376,332 B1* | 4/2002 | Yanagita | H01L 21/76259 |
| | | | 438/458 |
| 7,351,300 B2* | 4/2008 | Takayama | B32B 7/06 |
| | | | 156/239 |
| 9,472,437 B2* | 10/2016 | George | H01L 21/6838 |
| 10,211,077 B2* | 2/2019 | Zhang | H01L 21/67092 |
| 2013/0025796 A1* | 1/2013 | Burggraf | B32B 37/025 |
| | | | 156/703 |
| 2015/0059987 A1* | 3/2015 | Kumakura | G02B 6/00 |
| | | | 156/714 |
| 2015/0319893 A1* | 11/2015 | Ohno | B32B 43/006 |
| | | | 156/702 |
| 2016/0093518 A1* | 3/2016 | Jung | B32B 43/006 |
| | | | 156/751 |
| 2017/0266947 A1* | 9/2017 | Tateyama | B32B 7/04 |
| 2018/0147825 A1* | 5/2018 | Tsao | H01L 21/681 |
| 2020/0051847 A1* | 2/2020 | Kiuchi | H01L 21/68785 |

* cited by examiner

METHOD OF REMOVING CARRIER PLATE

BACKGROUND OF THE INVENTION

Field of the Invention

The present invention relates to a method of removing a carrier plate from a workpiece that is disposed on a face side of the carrier plate with a temporary adhesive layer interposed therebetween.

Description of the Related Art

Electronic appliances exemplified by mobile phones and personal computers include as their indispensable components device chips having devices such as electronic circuits. Device chips are fabricated by demarcating the face side of a wafer made of a semiconductor material such as silicon into a plurality of areas with a grid of projected dicing lines or streets on the wafer, forming devices in the respective areas, and then dividing the wafer along the projected dicing lines.

Device chips thus fabricated are secured to mother substrates for chip size packages (CSP), electrically connected to terminals on the mother substrates by a process such as wire bonding, and then encapsulated by a molding resin. The device chips thus encapsulated by the molding resin provide packaged devices that protect the device chips from external factors including shocks, light, heat, water, etc.

Recent years have seen the advent of a packaging technology called Fan-Out Wafer Level Packaging (FOWLP) that forms package terminals outside of the area of device chips using a wafer-level redistribution technology (see, for example, JP2016-201519A). There has also been proposed a packaging technology called Fan-Out Panel Level Packaging (FOPLP) for manufacturing packaged devices all together at the level of panels, typically glass substrates for use in the manufacture of liquid crystal panels, larger in size than wafers.

According to FOPLP, a redistribution layer (RDL) is formed on a face side of a carrier plate as a temporary substrate with a temporary adhesive layer interposed therebetween, and device chips are joined to the redistribution layer. Then, the device chips are encapsulated by a molding resin, producing a packaged panel. Thereafter, the packaged panel is thinned by grinding or the like and then divided into packaged devices.

SUMMARY OF THE INVENTION

According to FOPLP, after the packaged panel is divided into packaged devices, the carrier plates are removed from the packaged devices. Specifically, the package devices are picked up from the respective carrier plates. However, if the packaged devices are small in size, then it is difficult to pick up the package devices from the carrier plates.

It might be an option to peel off and remove the carrier plate from the packaged panel before the packaged panel is divided into packaged devices. However, since the bonding strength of the temporary adhesive layer is rather strong, it would be difficult to peel off the carrier plate from the packaged panel without causing damage to the packaged panel and the carrier plate.

It is therefore an object of the present invention to provide a method of removing a carrier plate easily from a workpiece such as a packaged panel.

In accordance with an aspect of the present invention, there is provided a method of removing a carrier plate from a workpiece of a disk-shaped composite substrate in which the workpiece is disposed on a face side of the carrier plate with a temporary adhesive layer interposed therebetween. The method includes a step forming step of forming a step protruding laterally from the carrier plate more on a reverse side of the carrier plate than on the face side of the carrier plate, by removing an outer circumferential portion of the workpiece, an outer circumferential portion of the temporary adhesive layer, and a face-side side of an outer circumferential edge of the carrier plate, a starting point region forming step of forming a starting point region that acts as a starting point in peeling off the carrier plate from the workpiece, by removing a partial region of the workpiece that is adjacent to the outer circumferential portion of the workpiece, a holding step of, after the step and the starting point region have been formed, holding the workpiece from above with a holding unit while the workpiece is positioned above the carrier plate, and a carrier plate removing step, after the workpiece has been held by the holding unit, peeling off and removing the carrier plate from the workpiece by applying a downward force from a pusher to the step to move the carrier plate in a direction away from the workpiece.

In the aspect of the present invention, the carrier plate removing step may include peeling off and removing the carrier plate from the workpiece by applying the downward force to the step after applying a fluid to the temporary adhesive layer that is exposed between the workpiece and the carrier plate or while applying a fluid to the temporary adhesive layer that is exposed between the workpiece and the carrier plate.

In the aspect of the present invention, the carrier plate removing step may include applying the downward force to the step while the workpiece and the carrier plate are immersed in a liquid. Further, the liquid may contain a surface active agent.

In the aspect of the present invention, the carrier plate removing step may include applying the downward force to the step while the workpiece and the carrier plate are immersed in the liquid and while vibrations are being applied to the pusher.

In the aspect of the present invention, the carrier plate removing step may include applying the downward force to the step while the workpiece and the carrier plate are immersed in the liquid and while vibrations are being applied to the liquid.

In the method of removing a carrier plate according to the aspect of the present invention, a step protruding laterally from the carrier plate more on a reverse side of the carrier plate than on the face side of the carrier plate is formed by removing an outer circumferential portion of the workpiece, an outer circumferential portion of the temporary adhesive layer, and a face-side side of an outer circumferential edge of the carrier plate, and a starting point region that acts as a starting point in peeling off the carrier plate from the workpiece is formed by removing a partial region of the workpiece that is adjacent to the outer circumferential portion of the workpiece. Consequently, the carrier plate can easily be peeled off and removed from the workpiece with the starting point region acting as a starting point for starting to peel off the carrier plate, by holding the workpiece from above with the holding unit and applying a downward force to the step. Since the gravitational force acting on the carrier plate is also used in addition to the downward force applied to the step, no large force is required to remove the carrier plate from the workpiece.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1:
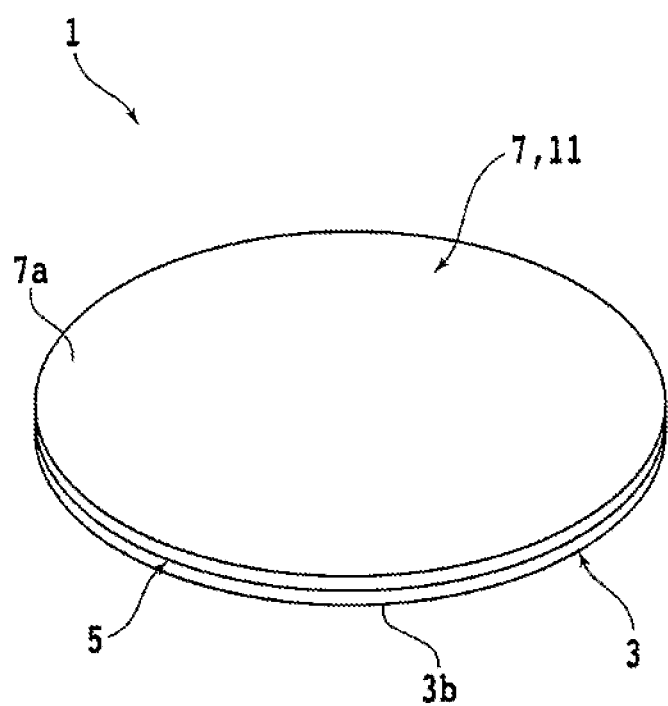
FIG. 1 is a perspective view illustrating a structural example of a disk-shaped composite substrate including a carrier plate and a workpiece.
Figure 2A:
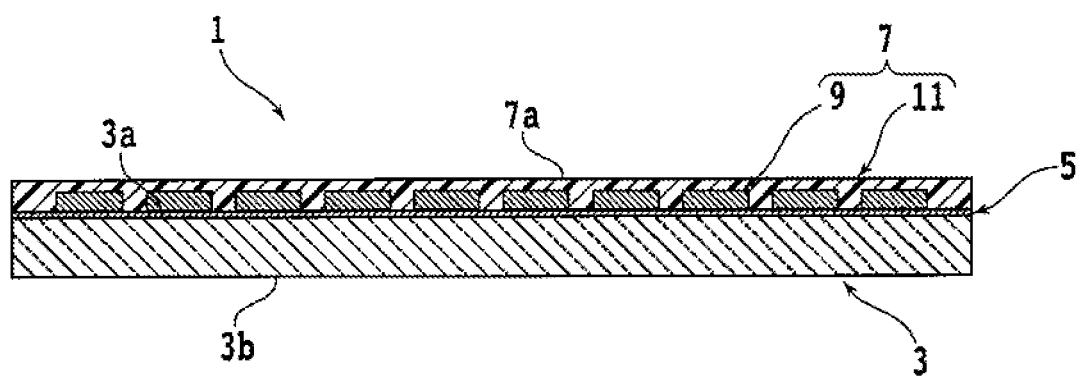
FIG. 2A is a cross-sectional view illustrating the structural example of the composite substrate.
Figure 2B:
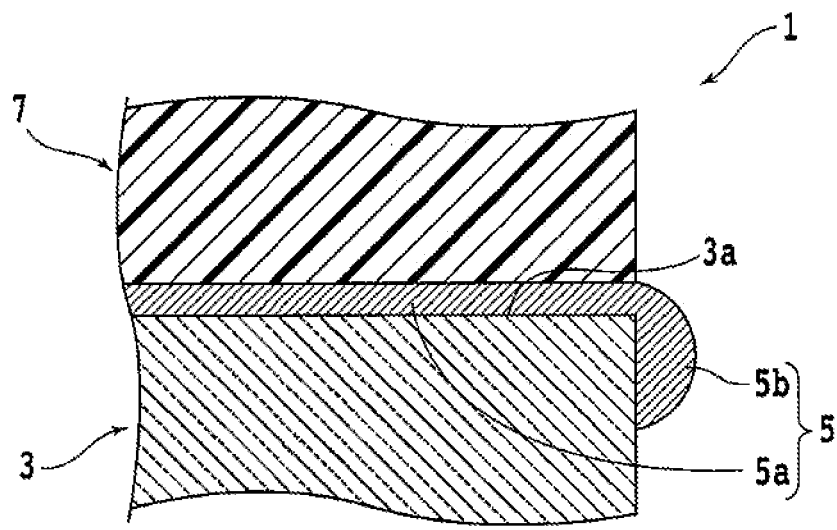
FIG. 2B is a fragmentary enlarged cross-sectional view of a portion of the composite substrate illustrated in FIG. 2A.

Preferred embodiments of the present invention will be described below with reference to the accompanying drawings. FIG. 1 illustrates in perspective a structural example of a disk-shaped composite substrate 1 used in a method of removing a carrier plate according to a preferred embodiment of the present invention. FIG. 2A illustrates in cross section the structural example of the composite substrate 1. FIG. 2B illustrates in fragmentary enlarged cross section a portion of the composite substrate 1 illustrated in FIG. 2A.

The composite substrate 1 includes a carrier plate 3 made of an insulating material such as soda glass, borosilicate glass, or quartz glass. The carrier plate 3 has a first surface, i.e., a face side, 3a that is generally flat and a second surface, i.e., a reverse side, 3b that is opposite the first surface 3a. The carrier plate 3 is of a disk shape that is circular as viewed from the first surface 3a or the second surface 3b side. The carrier plate 3 has a thickness of 2 mm or smaller, typically 1.1 mm, for example.

According to the present embodiment, the carrier plate 3 is made of an insulating material such as soda glass, borosilicate glass, or quartz glass. However, the carrier plate 3 is not limited to any particular material, structure, size, etc. For example, a plate made of semiconductor, ceramic, resin, metal, etc. may be used as the carrier plate 3.

A workpiece 7 is disposed on the first surface 3a of the carrier plate 3 with a temporary adhesive layer 5 interposed therebetween. The temporary adhesive layer 5 is formed of a metal film, an insulating film, etc. stacked on the first surface 3a generally in its entirety, and has a function to bond the carrier plate 3 and the workpiece 7 to each other. The temporary adhesive layer 5 may be formed of a resin film, etc. functioning as an adhesive.

The temporary adhesive layer 5 has a thickness of 20 µm or smaller, typically 5 µm, for example. The temporary adhesive layer 5 includes a central portion 5a bonding the carrier plate 3 and the workpiece 7 to each other and an outer circumferential portion 5b covering a first surface 3a side of an outer circumferential edge of the carrier plate 3. The outer circumferential portion 5b of the temporary adhesive layer 5 is fixed to the carrier plate 3 and cannot easily be peeled off.

When the carrier plate 3 is peeled off and removed from the workpiece 7, the central portion 5a of the temporary adhesive layer 5 is separated into a first portion 5c (see FIG. 6C) adhering to the carrier plate 3 and a second portion 5d (see FIG. 6C) adhering to the workpiece 7. Before peeling off and removing the carrier plate 3 from the workpiece 7, it is desirable to remove the outer circumferential portion 5b fixed to the carrier plate 3 in order to separate the central portion 5a appropriately.

The workpiece 7 is also referred to as a packaged panel, a packaged wafer, or the like, for example. The workpiece 7 includes a redistribution layer (RDL), not illustrated, held against the central portion 5a of the temporary adhesive layer 5, a plurality of device chips 9 joined to the redistribution layer, and a molding resin layer 11 that encapsulates the device chips 9 individually. The workpiece 7 is of a disk shape similar to the carrier plate 3, for example. The workpiece 7 has a thickness of 1.5 mm or smaller, typically 0.6 mm, for example.

The workpiece 7 has a first surface, i.e., a face side, 7a remote from the temporary adhesive layer 5. The first surface 7a may be processed by a grinding process or the like. Projected dicing lines are established in regions in the workpiece 7 that lie between adjacent ones of the device chips 9. When the workpiece 7 is divided along any desired ones of the projected dicing lines, for example, the workpiece 7 is divided into a plurality of workpiece pieces each including one or more of the device chips 9.

When the workpiece 7 or each of the workpiece pieces is divided along all the projected dicing lines, a plurality of packaged devices corresponding to the respective device chips 9 are obtained. The workpiece 7 is not limited to any particular material, structure, size, etc. For example, the workpiece 7 may primarily include an interconnect layer, and may not include device chips 9, a molding resin layer 11, etc.

Figure 3A:
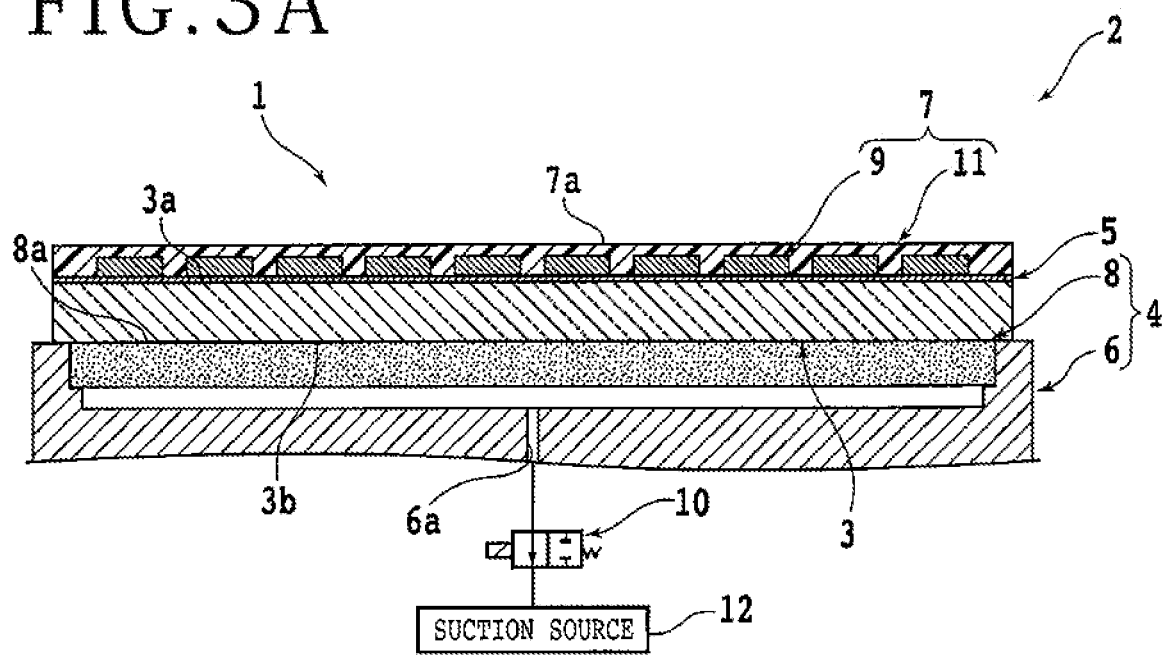
FIG. 3A is a cross-sectional view illustrating a manner in which a carrier plate side of the composite substrate is held in place.

In the method of removing a carrier plate according to the present embodiment, a step is initially formed in an outer circumferential portion of the carrier plate 3 by removing an outer circumferential edge of the carrier plate 3 on the first surface 3a side as well as an outer circumferential portion of the workpiece 7 and the outer circumferential portion 5b of the temporary adhesive layer 5 (step forming step). FIG. 3A illustrates in cross section the manner in which the carrier plate 3 side of the composite substrate 1 is held in place, and FIG. 3B illustrates in cross section the manner in which a step is formed in the carrier plate 3.

Figure 3B:
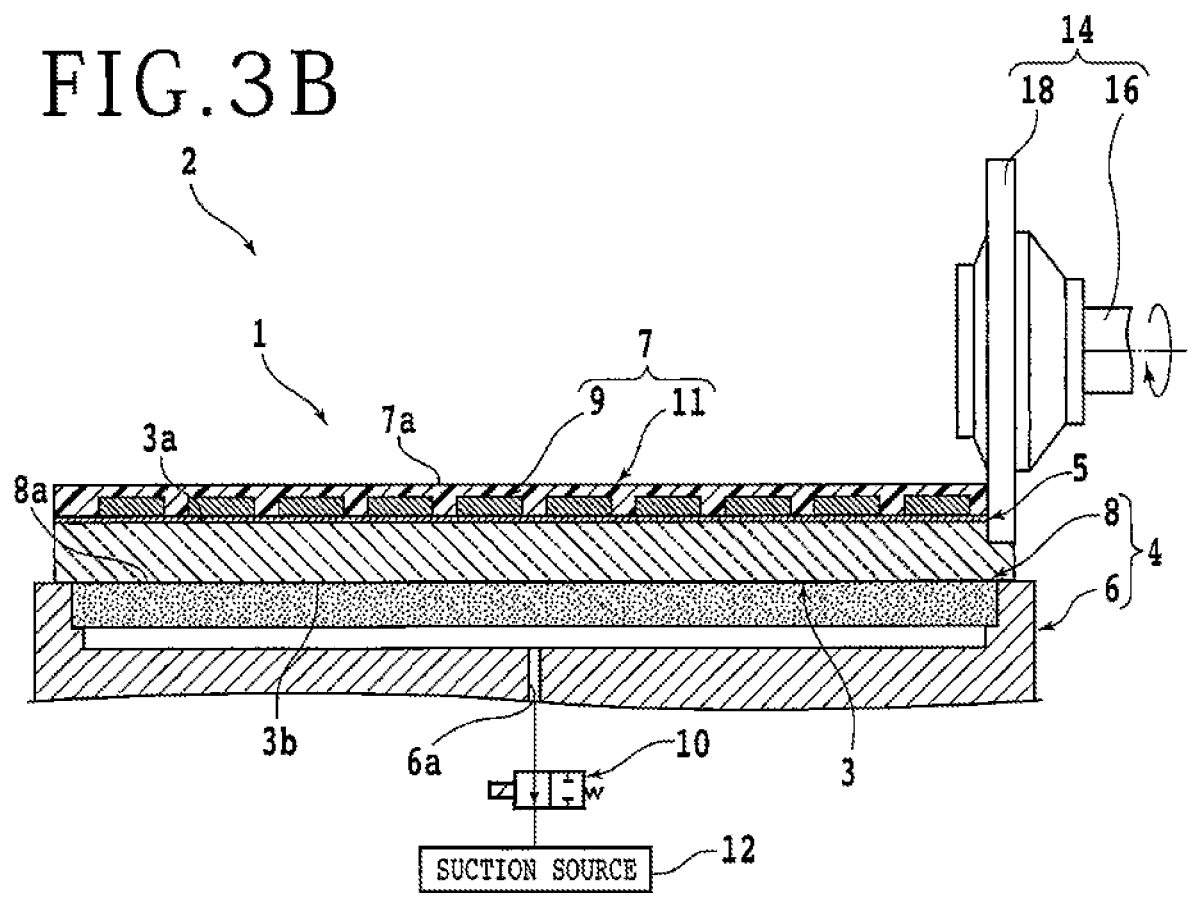
FIG. 3B is a cross-sectional view illustrating a manner in which a step is formed in the carrier plate.

A cutting apparatus 2 illustrated in FIGS. 3A and 3B is used to form a step in the outer circumferential portion of the carrier plate 3. The cutting apparatus 2 includes a chuck table 4 for holding the composite substrate 1 thereon. The chuck table 4 includes a cylindrical frame 6 made of a metal material exemplified by stainless steel, for example, and a holding plate 8 made of a porous material and disposed on an upper portion of the frame 6.

The holding plate 8 has an upper surface as a holding surface 8a for attracting the carrier plate 3 of the composite substrate 1 under suction and holding the carrier plate 3 thereon. The holding plate 8 has a lower surface held in fluid communication with a suction source 12 through a fluid channel 6a defined in the frame 6, a valve 10, and so on. When the valve 10 is opened, a negative pressure from the suction source 12 acts through the fluid channel 6a and the holding plate 8 on the holding surface 8a thereof.

The chuck table 4, i.e., the frame 6, is coupled to a rotary actuator, not illustrated, such as an electric motor. The chuck table 4 is rotatable about a rotational axis generally perpendicular to the holding surface 8a by forces generated by the rotary actuator. The chuck table 4, i.e., the frame 6, is supported by a processing feed mechanism, not illustrated, and movable in processing feed directions generally parallel to the holding surface 8a.

As illustrated in FIG. 3B, a cutting unit 14 is disposed above the chuck table 4. The cutting unit 14 includes a spindle 16 having a rotational axis generally parallel to the holding surface 8a. An annular cutting blade 18 made of abrasive grains dispersed in a binder is mounted on one end of the spindle 16.

Another end of the spindle 16 is coupled to a rotary actuator, not illustrated, such as an electric motor. The cutting blade 18 mounted on the one end of the spindle 16 is rotatable about its own axis by forces generated by the rotary actuator. The cutting unit 14 is supported by a lifting and lowering mechanism, not illustrated, and an indexing feed mechanism, not illustrated, for example, and movable in vertical directions generally perpendicular to the holding surface 8a and indexing feed directions generally perpendicular to the vertical directions and the processing feed directions.

For forming a step in the outer circumferential portion of the carrier plate 3, the carrier plate 3 of the composite substrate 1 is held in place with the workpiece 7 exposed upwardly. Specifically, as illustrated in FIG. 3A, the second surface 3b of the carrier plate 3 is held in contact with the holding surface 8a of the chuck table 4, and then the valve 10 is opened to allow the negative pressure from the suction source 12 to act on the holding surface 8a. The carrier plate 3 of the composite substrate 1 is held under suction on the chuck table 4, exposing the workpiece 7 upwardly.

Next, the cutting blade 18 is caused to cut into the outer circumferential portion of the composite substrate 1, removing the outer circumferential portion of the workpiece 7, the outer circumferential portion 5b of the temporary adhesive layer 5, and the first surface 3a side of the outer circumferential edge of the carrier plate 3. Specifically, as illustrated in FIG. 3B, the chuck table 4 and the cutting unit 14 are adjusted in their relative positions, and the cutting blade 18 as it is rotating is caused to cut into the outer circumferential portion of the composite substrate 1. Then, the chuck table 4 is rotated about its central axis.

According to the present embodiment, the chuck table 4 and the cutting unit 14 are adjusted in their relative positions to position a lower end of the cutting blade 18 in a position lower than the first surface 3a of the carrier plate 3 and higher than the second surface 3b thereof. According to the present embodiment, moreover, the chuck table 4 is rotated by one revolution or more.

In this manner, the outer circumferential portion of the workpiece 7, the outer circumferential portion 5b of the temporary adhesive layer 5, and the first surface 3a side of the outer circumferential edge of the carrier plate 3 are removed fully circumferentially around the composite substrate 1, thereby forming a step 3c (see FIGS. 4A, 4B, etc.) in the outer circumferential portion of the carrier plate 3 where the second surface 3b side protrudes more laterally, i.e., more radially outwardly with respect to the carrier plate 3, than the first surface 3a side.

According to the present embodiment, the step 3c is formed in the carrier plate 3 by having the cutting blade 18 cut into the carrier plate 3. However, the step 3c may be formed otherwise. For example, the step 3c may be formed in the carrier plate 3 by a laser ablation process that uses a laser beam having a wavelength that is absorbed by the carrier plate 3. In this case, a laser processing apparatus, i.e., a laser processing unit, for applying a laser beam having a wavelength that is absorbed by the carrier plate 3, etc. is used instead of the cutting apparatus 2, i.e., the cutting unit 14.

Figure 4A:
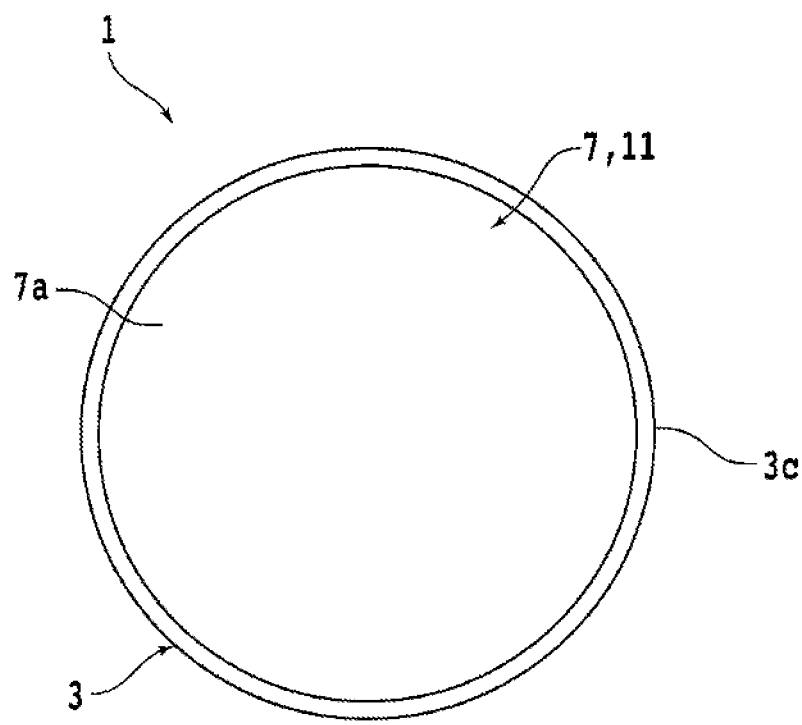
FIG. 4A is a plan view illustrating a manner in which the step has been formed in the carrier plate on an entire outer circumferential portion thereof.
Figure 4B:
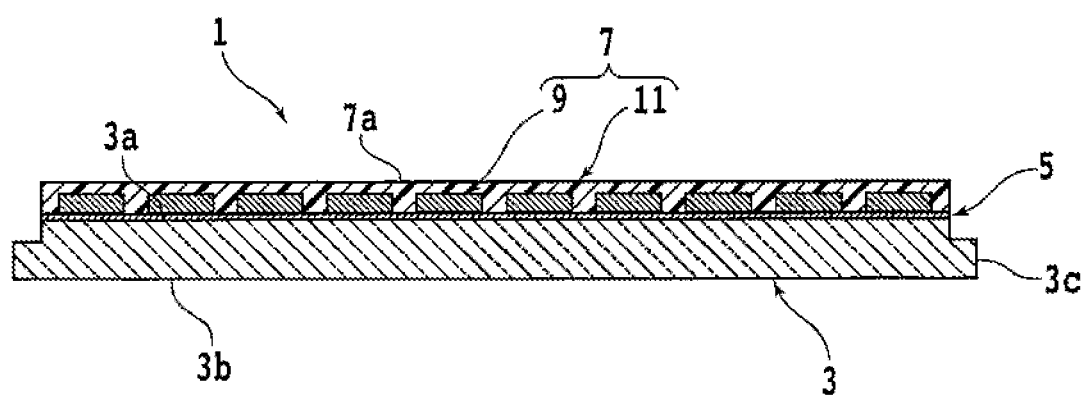
FIG. 4B is a cross-sectional view illustrating the manner in which the step has been formed in the carrier plate on the entire outer circumferential portion thereof.

FIG. 4A illustrates in plan the manner in which the step 3c has been formed in the carrier plate 3 on the entire outer circumferential portion thereof. FIG. 4B illustrates in cross section the manner in which the step 3c has been formed in the carrier plate 3 on the entire outer circumferential portion thereof. According to the present embodiment, the step 3c is formed in the carrier plate 3 on the entire outer circumferential portion thereof. However, the step according to the present invention may be formed in the carrier plate on at least a portion of the outer circumferential portion thereof.

The step 3c has a width, i.e., the width of an overlap between the carrier plate 3 and the cutting blade 18, set to a desired value insofar as it does not adversely affect packaged devices to be produced from the workpiece 7. In view of the ease with which to remove the carrier plate 3, the width of the step 3c should preferably be set to a value in the range from 0.2 mm to 5 mm.

Figure 5:
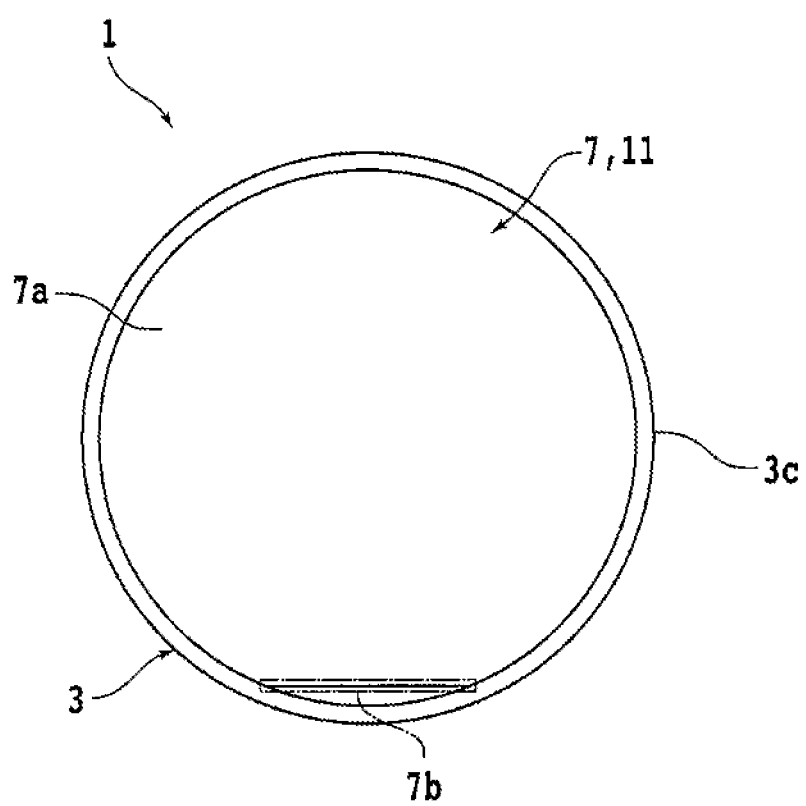
FIG. 5 is a plan view illustrating a manner in which a starting point region has been formed in the workpiece.

After the step 3c has been formed in the carrier plate 3 on the outer circumferential portion thereof, a partial region of the workpiece 7 that is adjoined to the new outer circumferential edge of the workpiece 7, i.e., a partial region of the workpiece 7 that is adjacent to the outer circumferential portion of the workpiece 7 that has been removed upon the formation of the step 3c, is additionally removed to form a starting point region that acts as a starting point in peeling off the carrier plate 3 from the workpiece 7 (starting point region forming step). FIG. 5 illustrates in plan the manner in which a starting point region 7b has been formed in the workpiece 7.

For forming the starting point region 7b in the workpiece 7, the cutting apparatus 2 described above is used, for example. Specifically, the carrier plate 3 of the composite substrate 1 is held on the chuck table 4 such that the workpiece 7 of the composite substrate 1 is exposed upwardly. Then, the cutting blade 18 as it is rotating is caused to cut into the workpiece 7 and the temporary adhesive layer 5, while at the same time the chuck table 4 and the cutting unit 14 are moved relatively to each other.

A partial region of the workpiece 7 is thus additionally removed, thereby forming the starting point region 7b that acts as a starting point in peeling off the carrier plate 3 from the workpiece 7. According to the present embodiment, as illustrated in FIG. 5, the workpiece 7 is cut straight at a position corresponding to a chord of a circle representing the profile of the workpiece 7, forming the starting point region 7b that has corners at both ends thereof.

In this case, forces applied to peel off the carrier plate 3 concentrate on the corners of the starting point region 7b, making it easy to peel off the carrier plate 3. Stated otherwise, if it were not for the starting point region 7b, forces applied to peel off the carrier plate 3 would be dispersed on a curved, i.e., arcuate, outer circumferential edge of the workpiece 7 and would not appropriately act on the carrier plate 3.

According to the present embodiment, the cutting blade 18 is caused to cut into the workpiece 7 to form the starting point region 7b. However, the starting point region 7b may be formed otherwise. For example, the starting point region 7b may be formed by a laser ablation process that uses a laser beam having a wavelength that is absorbed by the workpiece 7.

Figure 6A:
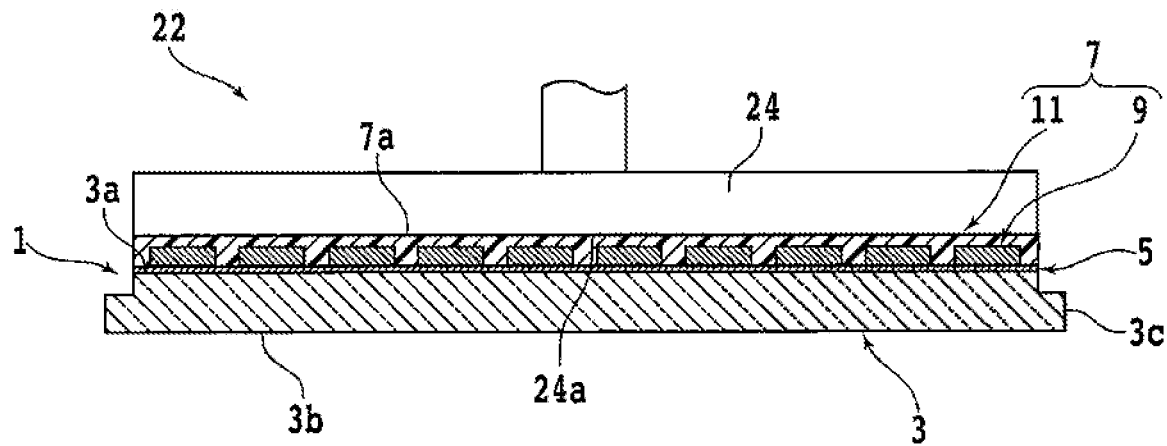
FIG. 6A is a cross-sectional view illustrating a manner in which the workpiece is held in place from above.

After the starting point region 7b has been formed, the workpiece 7 of the composite substrate 1 is held in place from above (holding step). FIG. 6A illustrates in cross section the manner in which the workpiece 7 is held in place from above. For holding the workpiece 7 in place from above, a peeling apparatus 22 illustrated in FIG. 6A, etc. is used. The peeling apparatus 22 includes a holding unit 24 for holding the workpiece 7 of the composite substrate 1 in place from above.

The holding unit 24 includes a lower portion having a holding surface 24a that is of substantially the same size as the first surface 7a of the workpiece 7. The holding surface 24a is connected to a suction source, not illustrated, through a fluid channel, not illustrated, a valve, not illustrated, and so on. When the valve is opened, a negative pressure from the suction source acts through the fluid channel and the valve on the holding surface 24a. The holding unit 24 is supported by a lifting and lowering mechanism, not illustrated, and movable in the vertical directions.

For holding the workpiece 7 from above, as illustrated in FIG. 6A, while the workpiece 7 is positioned above the carrier plate 3, the holding surface 24a of the holding unit 24 is brought into contact with the first surface 7a of the workpiece 7. Then, the valve is opened to apply the negative pressure from the suction source to the holding surface 24a. The workpiece 7 of the composite substrate 1 is now held in place from above by the holding unit 24.

According to the present embodiment, the first surface 7a of the workpiece 7 is directly held in contact with the holding surface 24a of the holding unit 24. However, a porous sheet or the like may be interposed between the first surface 7a of the workpiece 7 and the holding surface 24a of the holding unit 24. The porous sheet thus interposed is effective to prevent the workpiece 7 from being damaged, contaminated, or otherwise adversely affected by the holding surface 24a that would otherwise directly contact the workpiece 7.

Furthermore, offcuts produced from the workpiece 7 when the starting point region 7b was formed tend to remain on the composite substrate 1. Therefore, when the holding unit 24 is to hold the workpiece 7, the holding unit 24 may hold the portion of the workpiece 7 except for those offcuts. Needless to say, the holding unit 24 may hold the entire workpiece 7 including those offcuts.

Figure 6B:
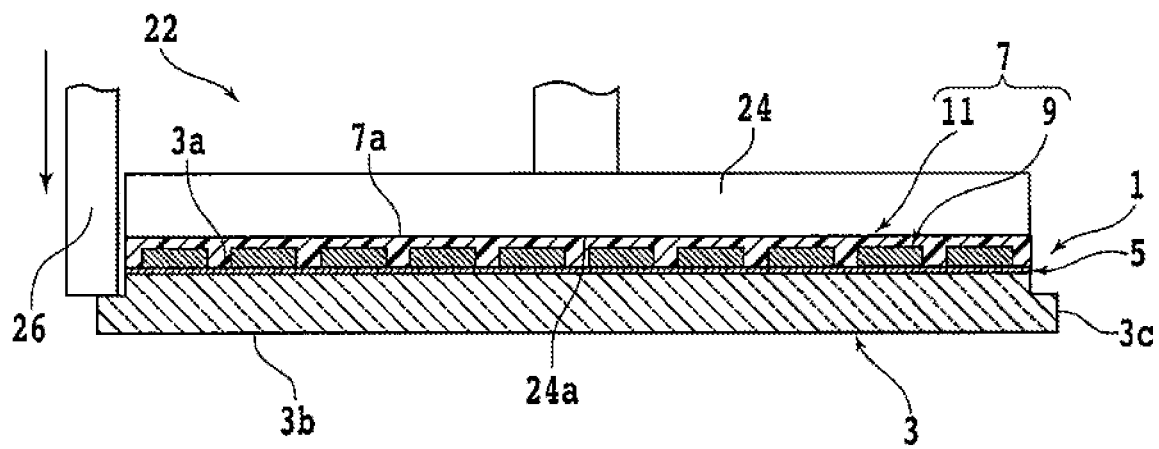
FIG. 6B is a cross-sectional view illustrating a manner in which a downward force is applied to the step.
Figure 6C:
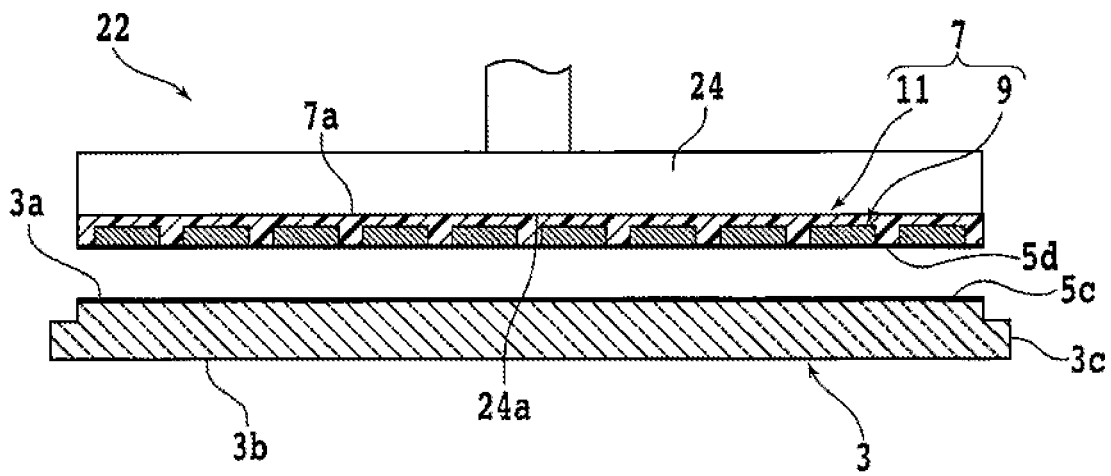
FIG. 6C is a cross-sectional view illustrating a manner in which the carrier plate has been peeled off from the workpiece.

After the workpiece 7 has been held in place from above, a downward force is applied to the step 3c to peel off and remove the carrier plate 3 from the workpiece 7 (carrier plate removing step). FIG. 6B illustrates in cross section the manner in which a downward force is applied to the step 3c, and FIG. 6C illustrates in cross section the manner in which the carrier plate 3 has been peeled off from the workpiece 7. For peeling off the carrier plate 8 from the workpiece 7, the peeling apparatus 22 is also used.

As illustrated in FIG. 6B, the peeling apparatus 22 includes a rod-shaped pusher 26 disposed at a position corresponding to the step 3c of the composite substrate 1 held by the holding unit 24. The pusher 26 is supported by a lifting and lowering mechanism that is different from the lifting and lowering mechanism for moving the holding unit 24, for example, and is movable vertically independently of the holding unit 24.

For removing the carrier plate 3 from the workpiece 7, both the holding unit 24 and the pusher 26 are moved upwardly, lifting the composite substrate 1 held by the holding unit 24. The second surface 3b of the carrier plate 3 is now exposed downwardly. Next, while the holding unit 24 is being kept in the upper position, the pusher 26 is moved downwardly to bring a lower end thereof into contact with the step 3c. Stated otherwise, the pusher 26 applies a downward force to the step 3c of the carrier plate 3.

As described above, the workpiece 7 of the composite substrate 1 is held in place from above by the holding unit 24. Therefore, when the pusher 26 applies the downward force to the step 3c of the carrier plate 3, the carrier plate 3 is peeled off and drops from the workpiece 7 with the temporary adhesive layer 5 at the boundary. In other words, the carrier plate 3 is moved in a direction away from the workpiece 7. According to the present embodiment, since the outer circumferential portion 5b of the temporary adhesive layer 5 fixed to the carrier plate 3 has been removed upon the formation of the step 3c, the carrier plate 3 can easily be peeled off and removed from the workpiece 7.

According to the present embodiment, furthermore, as the starting point region 7b with the corners has been formed in the workpiece 7, the forces applied to peel off the carrier plate 3 concentrate on the corners of the starting point region 7b, making it easy to peel off the carrier plate 3 from the workpiece 7. For making the forces applied to peel off the carrier plate 3 act more strongly on the corners of the starting point region 7b, the pusher 26 may apply the downward force to a portion of the step 3c that is adjacent to the starting point region 7b, i.e., a portion of the step 3c that is positioned radially outwardly of the starting point region 7b. In this manner the carrier plate 3 can more easily be peeled off and removed from the workpiece 7.

With the method of removing a carrier plate according to the present embodiment, as described above, the outer circumferential portion of the workpiece 7, the outer circumferential portion 5b of the temporary adhesive layer 5, and the first surface, i.e., the face side, 3a side of the outer circumferential edge of the carrier plate 3 are removed, thereby forming the step 3c in the outer circumferential portion of the carrier plate 3 where the second surface 3b side of the carrier plate 3 protrudes more laterally than the first surface 3a side thereof, and the partial region of the workpiece 7 that is adjoined to the new outer circumferential edge of the workpiece 7, i.e., the partial region of the workpiece 7 that is adjacent to the outer circumferential portion of the workpiece 7 that has been removed upon the formation of the step 3c, is removed to form the starting point region 7b that acts as the starting point in peeling off the carrier plate 3 from the workpiece 7.

When the workpiece 7 is then held in place from above by the holding unit 24 and the downward force is applied to the step 3c, the carrier plate 3 can easily be peeled off and removed from the workpiece 7 with the starting point region 7b acting as the starting point for starting to peel off the carrier plate 3. Since the gravitational force acting on the carrier plate 3 is also used in addition to the downward force applied to the step 3c, no large force is required to remove the carrier plate 3 from the workpiece 7.

The present invention is not limited to the above embodiment, but various changes and modifications may be made therein. According to the above embodiment, for example, the starting point region 7b is formed in the workpiece 7 after the step 3c has been formed in the outer circumferential portion of the carrier plate 3. However, the step 3c may be formed in the outer circumferential portion of the carrier plate 3 after the starting point region 7b has been formed in the workpiece 7. In this case, the starting point region 7b is formed by removing a partial region of the workpiece 7 that is adjacent to the outer circumferential portion of the workpiece that is to be removed when the step 3c is formed.

Figure 7:
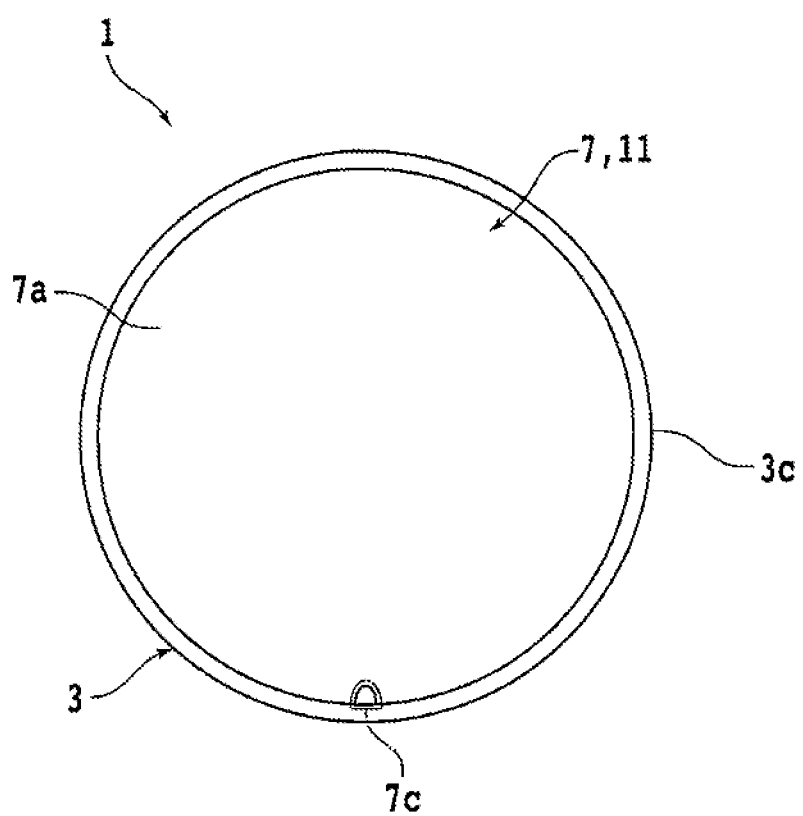
FIG. 7 is a plan view illustrating a starting point region formed by a method of removing a carrier plate according to a first modification.

According to the present embodiment, the workpiece 7 is cut straight at the position corresponding to the chord of the circle representing the profile of the workpiece 7, forming the starting point region 7b that has the corners at both ends thereof. According to the present invention, the shape, etc. of the starting point region may be changed insofar as it allows appropriate forces to act on the carrier plate to peel off the carrier plate. FIG. 7 illustrates in plan a starting point region 7c formed by a method of removing a carrier plate according to a first modification.

The procedure, etc. of the method of removing a carrier plate according to the first modification is the same as the procedure, etc. of the method of removing a carrier plate according to the above embodiment except for a procedure, etc. for forming the starting point region 7c. Therefore, the procedure, etc. for forming the starting point region 7c will mainly be described below, and the detailed description of other procedures, etc. will be omitted below.

The starting point region 7c illustrated in FIG. 7 is formed by a laser ablation process that uses a laser beam having a wavelength that is absorbed by the workpiece 7. Specifically, the laser beam is applied to the workpiece 7 for cutting, off the workpiece 7, a partial region of the workpiece 7 that is adjacent to the outer circumferential edge of the workpiece 7 that has been removed upon the formation of the step 3c, or the outer circumferential edge of the workpiece 7 that is to be removed upon the formation of the step 3c.

In this manner, the partial region of the workpiece 7 is removed to form the starting point region 7c that acts as a starting point in peeling off the carrier plate 3 from the workpiece 7. According to the first modification, as illustrated in FIG. 7, the workpiece 7 is cut to remove a semicircular region therefrom, forming the starting point region 7c that has corners. According to the first modification, the starting point region 7c is formed by the laser ablation process using the laser beam. However, the starting point region 7c may be formed otherwise.

According to a further alternative, for example, a groove may be formed in a partial region of the workpiece 7 that is adjacent to the outer circumferential edge of the workpiece 7 to remove the partial region, thereby forming a starting point region having corners. The formation of the groove is not limited to any particular process. However, a process of causing a cutting blade to cut into the workpiece 7, a laser ablation process that uses a laser beam having a wavelength that is absorbed by the workpiece 7, or the like, for example, may be used.

The pusher 26 according to the above embodiment is movable vertically independently of the holding unit 24. However, it is sufficient if the pusher 26 is movable relatively to at least the holding unit 24.

For example, the pusher 26 may be fixed to a housing, not illustrated, of the peeling apparatus 22, and the pusher 26 may be moved relatively to the holding unit 24 by moving only the holding unit 24. Although the single pusher 26 is used in the above embodiment, a plurality of pushers 26 may be used.

Figure 8A:
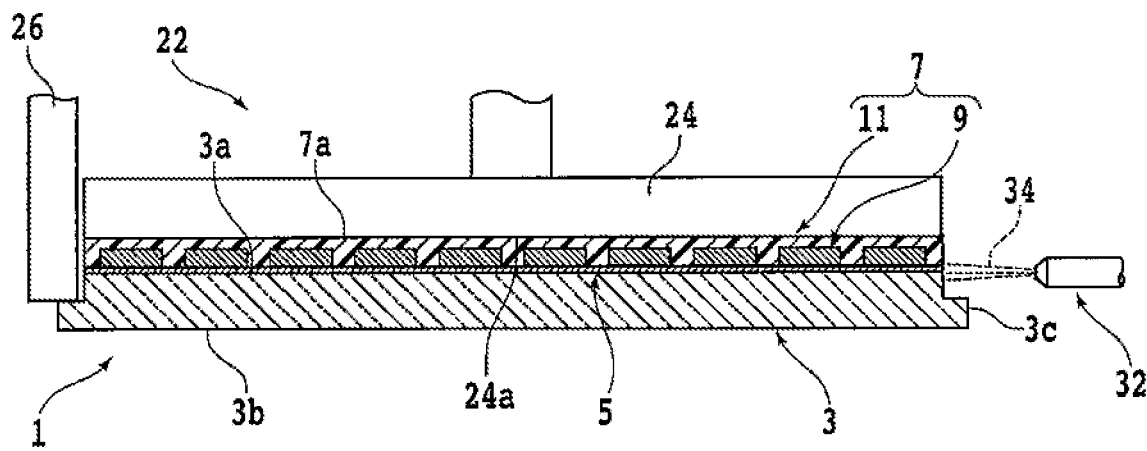
FIG. 8A is a cross-sectional view illustrating a manner in which a carrier plate is peeled off from a workpiece by a method of removing a carrier plate according to a second modification.

When the carrier plate 3 is to be peeled off from the workpiece 7, a fluid may be applied to the temporary adhesive layer 5 that is exposed between the carrier plate 3 and the workpiece 7. FIG. 8A illustrates in cross section the manner in which the carrier plate 3 is peeled off from the workpiece 7 by a method of removing a carrier plate according to a second modification.

The method of removing a carrier plate according to the second modification have many features in common with the method of removing a carrier plate according to the above embodiment. Therefore, the differences will mainly be described below, and the detailed description of the common features will be omitted below. As illustrated in FIG. 8A, a nozzle 32 is disposed laterally of the holding unit 24 of the peeling apparatus 22 that is used in the second modification. The nozzle 32 is connected to a supply source, not illustrated, of a fluid 34 through a fluid channel, not illustrated, a valve, not illustrated, and so on.

After the nozzle 32 has applied the fluid 34 to the temporary adhesive layer 5 that is exposed between the carrier plate 3 and the workpiece 7, or while the nozzle 32 is applying the fluid 34 to the temporary adhesive layer 5 that is exposed between the carrier plate 3 and the workpiece 7, the pusher 26 applies a downward force to the step 3c, peeling off the carrier plate 3 more easily from the workpiece 7. The fluid 34 applied between the carrier plate 3 and the workpiece 7 may be air, water, or the like, for example. However, the fluid 34 is not limited to any particular kind, etc.

Figure 8B:
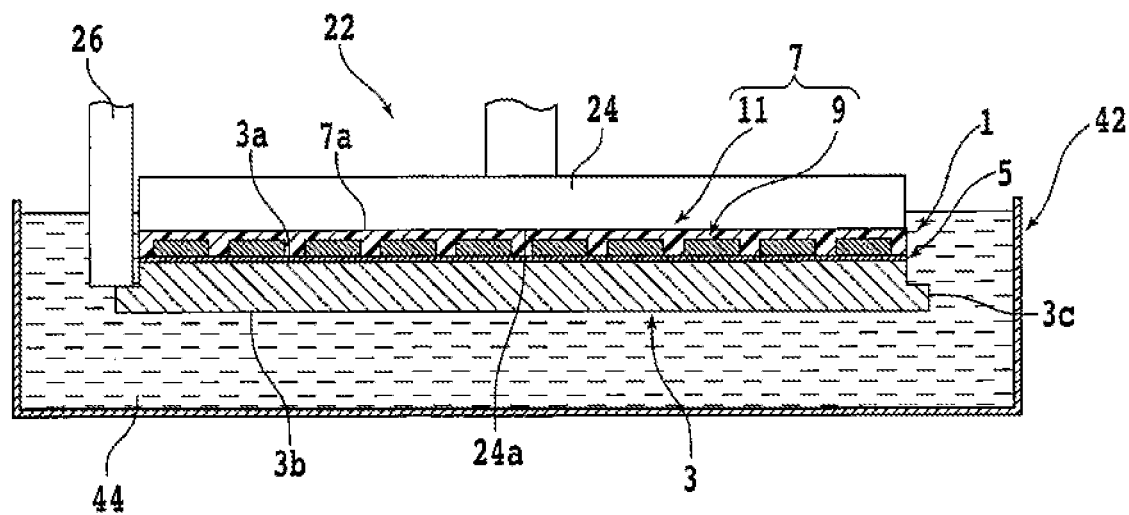
FIG. 8B is a cross-sectional view illustrating a manner in which a carrier plate is peeled off from a workpiece by a method of removing a carrier plate according to a third modification.

When the carrier plate 3 is to be peeled off from the workpiece 7, the carrier plate 3 and the workpiece 7 may be immersed in a liquid. FIG. 8B illustrates in cross section the manner in which the carrier plate 3 is peeled off from the workpiece 7 by a method of removing a carrier plate according to a third modification. The method of removing a carrier plate according to the third modification have many features in common with the method of removing a carrier plate according to the above embodiment. Therefore, the differences will mainly be described below, and the detailed description of the common features will be omitted below.

As illustrated in FIG. 8B, a bath 42 having a size large enough to house the carrier plate 3 and the workpiece 7 therein is disposed below the holding unit 24 of the peeling apparatus 22 that is used in the third modification. The bath 42 stores a liquid 44 such as water therein.

While the carrier plate 3 and the workpiece 7 are immersed in the liquid 44 in the bath 42, the pusher 26 applies a downward force to the step 3c, peeling off the carrier plate 3 from the workpiece 7. The carrier plate 3 as it is peeled off from the workpiece 7 falls in the liquid 44. As a result, the carrier plate 3 is subjected to a less shock from the fall than it falls in the air. Therefore, damage to the carrier plate 3, vibrations of the peeling apparatus 22, etc. are prevented.

The liquid 44 may contain a surface active agent. The surface active agent that may be contained in the liquid 44 may be an anionic surface active agent, a cationic surface active agent, or the like that is likely to enter the temporary adhesive layer 5. If the surface active agent that is likely to enter the temporary adhesive layer 5 is contained in the liquid 44, then the temporary adhesive layer 5 can easily be separated from a region where the surface active agent has entered, allowing the carrier plate 3 to be peeled off more easily from the workpiece 7.

According to the third modification, when the pusher 26 applies a downward force to the step 3c after the carrier plate 3 and the workpiece 7 have been immersed in the liquid 44, vibrations such as ultrasonic waves may be applied to the pusher 26. Specifically, while vibrations such as ultrasonic waves are being applied to the pusher 26, the pusher 26 applies a downward force to the step 3c. In this case, the action of the vibrations transmitted from the pusher 26 makes it easier to peel off the carrier plate 3 from the workpiece 7.

Similarly, when the pusher 26 applies a downward force to the step 3c after the carrier plate 3 and the workpiece 7 have been immersed in the liquid 44, vibrations such as ultrasonic waves may be applied to the liquid 44. Specifically, while vibrations such as ultrasonic waves are being applied to the liquid 44, the pusher 26 applies a downward force to the step 3c. In this case, the action of the vibrations transmitted from the liquid 44 makes it easier to peel off the carrier plate 3 from the workpiece 7.

In addition, the second modification may be combined with the third modification. Specifically, before or after the carrier plate 3 and the workpiece 7 are immersed in the liquid 44, a fluid may be applied to the temporary adhesive layer 5 that is exposed between the carrier plate 3 and the workpiece 7. In this case, similarly, it is made easier to peel off the carrier plate 3 from the workpiece 7.

The structures, methods, etc. according to the above embodiments may be appropriately changed or modified insofar as the changes or modifications fall within the scope of the invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of removing a carrier plate from a workpiece of a disk-shaped composite substrate in which the workpiece is disposed on a face side of the carrier plate with a temporary adhesive layer interposed therebetween, comprising:
    a step forming step of forming a step protruding laterally from the carrier plate more on a reverse side of the carrier plate than on the face side of the carrier plate, by removing an outer circumferential portion of the workpiece, an outer circumferential portion of the temporary adhesive layer, and a face-side side of an outer circumferential edge of the carrier plate;
    a starting point region forming step of forming a starting point region by cutting and removing a partial region of the workpiece that extends across the face side of the carrier plate inwardly of, and spaced from, the step protruding form the carrier plate, and from one point on the step to another point on the step;
    a holding step of, after the step and the starting point region have been formed, holding the workpiece from above with a holding unit while the workpiece is positioned above the carrier plate; and
    a carrier plate removing step, after the workpiece has been held by the holding unit, peeling off and removing the carrier plate from the workpiece by applying a downward force from a pusher to the step to move the carrier plate in a direction away from the workpiece,
    wherein the starting point region is formed after the step protruding from the carrier plate is formed.

2. The method of removing a carrier plate according to claim 1, wherein the carrier plate removing step includes peeling off and removing the carrier plate from the workpiece by applying the downward force to the step after applying a fluid to the temporary adhesive layer that is exposed between the workpiece and the carrier plate or while applying a fluid to the temporary adhesive layer that is exposed between the workpiece and the carrier plate.

3. The method of removing a carrier plate according to claim 2, wherein the carrier plate removing step includes applying the downward force to the step while the workpiece and the carrier plate are immersed in a liquid.

4. The method of removing a carrier plate according to claim 3, wherein the liquid contains a surface active agent.

5. The method of removing a carrier plate according to claim 4, wherein the carrier plate removing step includes applying the downward force to the step while the workpiece and the carrier plate are immersed in the liquid and while vibrations are being applied to the pusher.

6. The method of removing a carrier plate according to claim 4, wherein the carrier plate removing step includes applying the downward force to the step while the workpiece and the carrier plate are immersed in the liquid and while vibrations are being applied to the liquid.

7. The method of removing a carrier plate according to claim 3, wherein the carrier plate removing step includes applying the downward force to the step while the workpiece and the carrier plate are immersed in the liquid and while vibrations are being applied to the pusher.

8. The method of removing a carrier plate according to claim 3, wherein the carrier plate removing step includes applying the downward force to the step while the workpiece and the carrier plate are immersed in the liquid and while vibrations are being applied to the liquid.

9. The method of removing a carrier plate according to claim 1, wherein the carrier plate removing step includes applying the downward force to the step while the workpiece and the carrier plate are immersed in a liquid.

10. The method of removing a carrier plate according to claim 9, wherein the liquid contains a surface active agent.

11. The method of removing a carrier plate according to claim 10, wherein the carrier plate removing step includes applying the downward force to the step while the workpiece and the carrier plate are immersed in the liquid and while vibrations are being applied to the pusher.

12. The method of removing a carrier plate according to claim 10, wherein the carrier plate removing step includes applying the downward force to the step while the workpiece and the carrier plate are immersed in the liquid and while vibrations are being applied to the liquid.

13. The method of removing a carrier plate according to claim 9, wherein the carrier plate removing step includes applying the downward force to the step while the workpiece and the carrier plate are immersed in the liquid and while vibrations are being applied to the pusher.

14. The method of removing a carrier plate according to claim 9, wherein the carrier plate removing step includes applying the downward force to the step while the workpiece and the carrier plate are immersed in the liquid and while vibrations are being applied to the liquid.

15. The method of removing a carrier plate according to claim 1, wherein the starting point region is formed by cutting and removing the partial region of the workpiece along a straight line.

16. The method of removing a carrier plate according to claim 1, wherein the starting point region is formed by cutting and removing the partial region of the workpiece along a curved line.

17. The method of removing a carrier plate according to claim 1, wherein the partial region of the workpiece is cut and removed with a cutting blade or a laser beam to form the starting point region.

\* \* \* \* \*